(12) United States Patent
Sato et al.

(10) Patent No.: US 9,117,630 B2
(45) Date of Patent: Aug. 25, 2015

(54) INSULATION STRUCTURE OF HIGH VOLTAGE ELECTRODES FOR ION IMPLANTATION APPARATUS

(71) Applicant: SEN Corporation, Tokyo (JP)

(72) Inventors: Masateru Sato, Ehime (JP); Hiroshi Matsushita, Ehime (JP)

(73) Assignee: Sumitomo Heavy Industries Ion Technology Co., Ltd., Tokyo (JP)

( * ) Notice: Subject to any disclaimer, the term of this patent is extended or adjusted under 35 U.S.C. 154(b) by 0 days.

(21) Appl. No.: 14/229,038

(22) Filed: Mar. 28, 2014

(65) Prior Publication Data

US 2014/0291543 A1    Oct. 2, 2014

(30) Foreign Application Priority Data

Mar. 29, 2013   (JP) ................. 2013-070963

(51) Int. Cl.
*H01J 37/08* (2006.01)
*H01J 37/317* (2006.01)
*H01J 37/248* (2006.01)

(52) U.S. Cl.
CPC .......... *H01J 37/3171* (2013.01); *H01J 37/248* (2013.01); *H01J 2237/032* (2013.01); *H01J 2237/036* (2013.01); *H01J 2237/038* (2013.01); *H01J 2237/08* (2013.01)

(58) Field of Classification Search
USPC ..................................... 250/423 R
See application file for complete search history.

(56) References Cited

U.S. PATENT DOCUMENTS 4,631,448 A * 12/1986 Tamura et al. ........... 315/111.81
4,883,969 A * 11/1989 Ishida et al. .................. 250/427
5,144,143 A *  9/1992 Raspagliesi et al. .......... 250/426

FOREIGN PATENT DOCUMENTS

| JP | H08-124514 A | 5/1996 |
| JP | H10-106478 A | 4/1998 |
| JP | 2002-279929 A | 9/2002 |
| JP | 2010-531529 A | 9/2010 |
| WO | WO-2009/002736 A2 | 12/2008 |

* cited by examiner

*Primary Examiner* — Phillip A Johnston
(74) *Attorney, Agent, or Firm* — Fishman Stewart Yamaguchi PLLC

(57) ABSTRACT

An insulation structure of high voltage electrodes includes an insulator having an exposed surface and a conductor portion, which includes a joint region in contact with the insulator, and a heat-resistant portion provided, along at least part of an edge of the joint region, in such a manner as to be adjacent to the exposed surface of the insulator. The heat-resistant portion is formed of an electrically conductive material whose melting point is higher than that of the conductor portion. The heat-resistant portion may be so provided as to have a gap between the insulator and the exposed surface.

23 Claims, 10 Drawing Sheets

INSULATION STRUCTURE OF HIGH VOLTAGE ELECTRODES FOR ION IMPLANTATION APPARATUS

BACKGROUND OF THE INVENTION

1. Field of the Invention

The present invention relates to an insulation structure of high voltage electrodes suitable for an ion implantation apparatus.

2. Description of the Related Art

Known in the art is an apparatus provided with a first metal electrode, a second metal electrode, and an insulator provided between the first metal electrode and the second metal electrode. The insulator has at least one surface exposed to a vacuum in between the first metal electrode and the second electrode. This apparatus includes a first conductive layer, which is disposed between the first metal electrode and the insulator, and a second conductive layer, which is disposed between the second metal electrode and the insulator opposite to the first conductive layer. The first conductive layer prevents triple junction breakdown from occurring at an interface of the first electrode, the insulator and vacuum. The second conductive layer prevents triple junction breakdown from occurring at an interface of the second electrode, the insulator and vacuum.

The first and second conductive layers are bonded to the insulator at the atomic level without forming fine gaps therebetween. For example, the conductive layer is formed such that metal particles such as aluminum ones are doped into the insulator.

SUMMARY OF THE INVENTION

One of exemplary objects of an embodiment of the present invention is to provide an insulation structure of high voltage electrodes suitable for an ion implantation apparatus.

According to an embodiment of the present invention, an insulation structure of high voltage electrodes for an ion implantation apparatus includes: two conductor portions that are electrodes; and an insulator provided between the two conductor portions. The two conductor portions are individually connected to the insulator. The insulator has an exposed surface to a vacuum space. Each of the two conductor portions includes a conductor body having a joint region having contact with the insulator, an exposed region to the vacuum space, and a boundary zone lying between the joint region and the exposed region. At least one of the two conductor portions may have at least one conductor element disposed on the conductor body. The conductor element may be provided on at least part of the boundary zone in such a manner as to be adjacent to the exposed surface of the insulator, and the conductor element may be formed of a conductive material whose melting point is higher than that of the conductor portion.

According to another embodiment of the present invention, an insulation structure of high voltage electrode for an ion implantation apparatus includes: an insulator having an exposed surface; and a conductor portion including a joint region, having contact with the insulator, and a heat-resistant portion provided, along at least part of an edge of the joint region, in such a manner as to be adjacent to the exposed surface of the insulator. The heat-resistant portion may be so provided as to have a gap between the heat-resistant portion and the exposed surface of the insulator. The heat-resistant portion may be formed of a conductive material whose melting point is higher than that of the conductor portion.

According to still another embodiment of the present invention, a method for high voltage insulation for an ion implantation apparatus includes: forming a heat-resistant portion on a conductor portion, which is supported by an insulator having an exposed surface, such that the heat-resistant portion is located adjacent to the exposed surface of the insulator; and applying a high voltage to the conductor portion. The heat-resistant portion may be formed of a conductive material whose melting point is higher than that of the conductor portion.

According to still another embodiment of the present invention, an insulation structure of high voltage electrodes for an ion implantation apparatus includes: two conductor portions that are electrodes; and an insulator provided between the two conductor portions. The two conductor portions are individually connected to the insulator. The insulator has an exposed surface to an atmospheric space. Each of the two conductor portions includes a conductor body having a joint region having contact with the insulator, an exposed region to the atmospheric space, and a boundary zone lying between the joint region and the exposed region. At least one of the two conductor portions may have at least one conductor element disposed on the conductor body, and the conductor element may be provided on at least part of the boundary zone in such a manner as to be adjacent to the exposed surface of the insulator, and the conductor element may be formed of a conductive material whose melting point is higher than that of the conductor portion.

According to still another embodiment of the present invention, an insulation structure of high voltage electrodes for an ion implantation apparatus includes: two conductor portions that are electrodes; and an insulator provided between the two conductor portions. The two conductor portions are individually connected to the insulator. The insulator has a first surface exposed to a vacuum space and a second surface exposed to an atmospheric space. Each of the two conductor portions includes a conductor body having a joint region having contact with the insulator, a first exposed region to the vacuum space, a second exposed region to the atmospheric space, a first boundary zone lying between the joint region and the first exposed region, and a second boundary zone lying between the joint region and the second exposed region. At least one of the two conductor portions may have at least one conductor element disposed on the conductor body. The conductor element may be provided on at least part of the first boundary zone and/or the second boundary zone in such a manner as to be adjacent to the exposed surface of the insulator, and the conductor element may be formed of a conductive material whose melting point is higher than that of the conductor portion.

According to still another embodiment of the present invention, an insulation structure of high voltage electrodes for an ion implantation apparatus includes: two conductor portions that are electrodes; and an insulator provided between the two conductor portions. The two conductor portions are individually connected to the insulator. The insulator has an exposed surface to a fluid space. Each of the two conductor portions includes a conductor body having a joint region having contact with the insulator, an exposed region to the fluid space, and a boundary zone lying between the joint region and the exposed region. At least one of the two conductor portions may have at least one conductor element disposed on the conductor body. The conductor element may be provided on at least part of the boundary zone in such a manner as to be adjacent to the exposed surface of the insulator, and the conductor element may be formed of a conductive material whose melting point is higher than that of the conductor portion.

Optional combinations of the aforementioned constituting elements, and implementations of the invention in the form of methods, apparatuses, systems, and so forth may also be practiced as additional modes of the present invention.

BRIEF DESCRIPTION OF THE DRAWINGS

Embodiments will now be described, by way of example only, with reference to the accompanying drawings, which are meant to be exemplary, not limiting, and wherein like elements are numbered alike in several figures, in which.

DETAILED DESCRIPTION OF THE INVENTION

Figure 1:
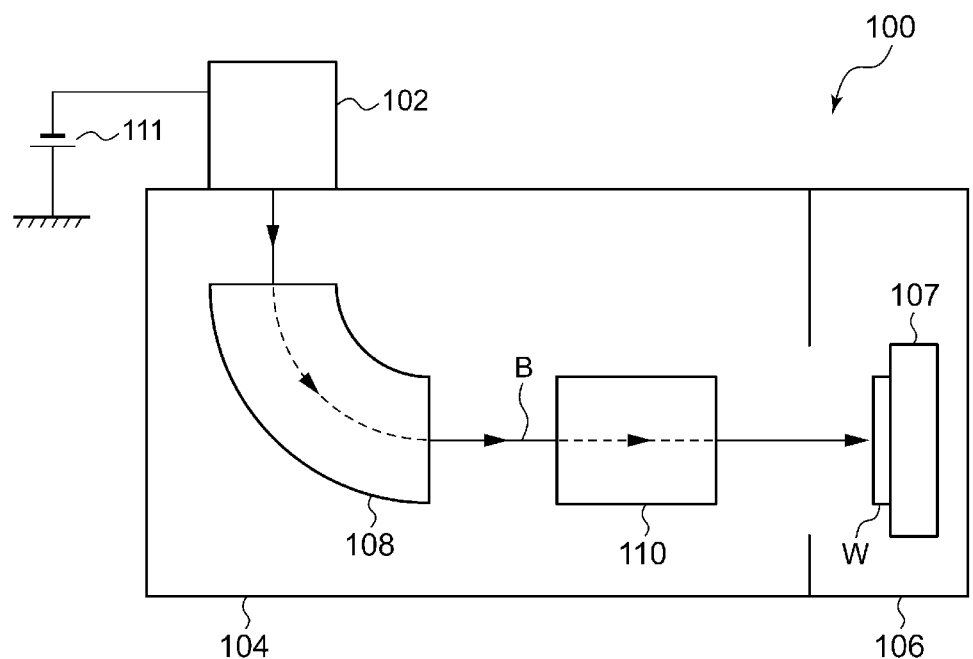
FIG. 1 is a diagram schematically illustrating an ion implantation apparatus according to an embodiment of the present invention.

The invention will now be described by reference to the preferred embodiments. This does not intend to limit the scope of the present invention, but to exemplify the invention.

The embodiments to achieve the present invention will be hereinbelow described in detail with reference to drawings. Note that in all of the Figures the same components are given the same reference numerals and the repeated description thereof is omitted as appropriate. The structures described hereinbelow are only exemplary and does not limit the scope of the present invention.

FIG. 1 is a diagram schematically illustrating an ion implantation apparatus 100 according to an embodiment of the present invention. The ion implantation apparatus 100 is configured such that a process of ion implantation is performed on a workpiece (substance) W in the surface thereof. The workpiece W, which is a substance or object to be processed, may be a substrate or a wafer, for instance. Thus, for convenience of explanation, the workpiece W is hereinafter referred to as a substrate W also, but this is not intended to limit an object, which undergoes the process of implantation, to any specific one.

The ion implantation apparatus 100 includes an ion source device 102, an beamline device 104, and an implantation processing chamber 106. The ion implantation apparatus 100 is configured such that the substrate W is irradiated all over with an ion beam B using at least one of beam scanning and mechanical scanning.

The ion source device 102 is configured such that the ion beam B is given to the beamline device 104. The ion source device 102 will be discussed later with reference to FIG. 2A.

The beamline device 104 is configured such that ions are transported from the ion source device 102 to the implantation processing chamber 106. A mass spectrometer 108 is provided downstream of the ion source device 102 and is configured such that necessary ions are selected to be the ion beam B.

The beamline device 104 performs operations, including deflection, acceleration, deceleration, shaping, scanning and the like, on the ion beam B that has passed through the mass spectrometer 108. The beamline device 104 may further include a beam scanning device 110 that scans the ion beam B by applying either one of or both of an electric field and a magnet field to the ion beam B. In this manner, the beamline device 104 supplies the ion beam B, with which the substrate W is irradiated, to the implantation processing chamber 106.

The implantation processing chamber 106 includes an object holder 107 that holds a single or a plurality of substrates W. The object holder 107 is configured such that the object holder 107 moves the substrate W relative to the ion beam B (i.e., so-called mechanical scanning) as necessary.

The ion implantation apparatus 100 also includes a vacuum exhaust system (not shown) that provides desired vacuum environments to the ion source device 102, the beamline device 104 and the implantation processing chamber 106. The vacuum exhaust system is used to evacuate an internal space 118 (see FIGS. 2A and 2B) of an ion source chamber 116 discussed later.

The ion implantation apparatus 100 includes a power-supply device 111 for the ion source device 102 and other components. The power-supply device 111 is configured such that a direct-current (DC) voltage, for example which is greater than or equal to 1 kV (e.g., several kV to several hundreds kV), is applied to an electrode. The power-supply device 111 is used to apply high voltages having different potentials to the ion source chamber 116 and an ion source support portion 120 (see FIG. 2A), respectively. Where necessary, the power-supply device 111 may be configured such that an alternate-current (AC) voltage having an effective value of 1 kV or above, for instance, is applied to the electrode.

Figure 2A:
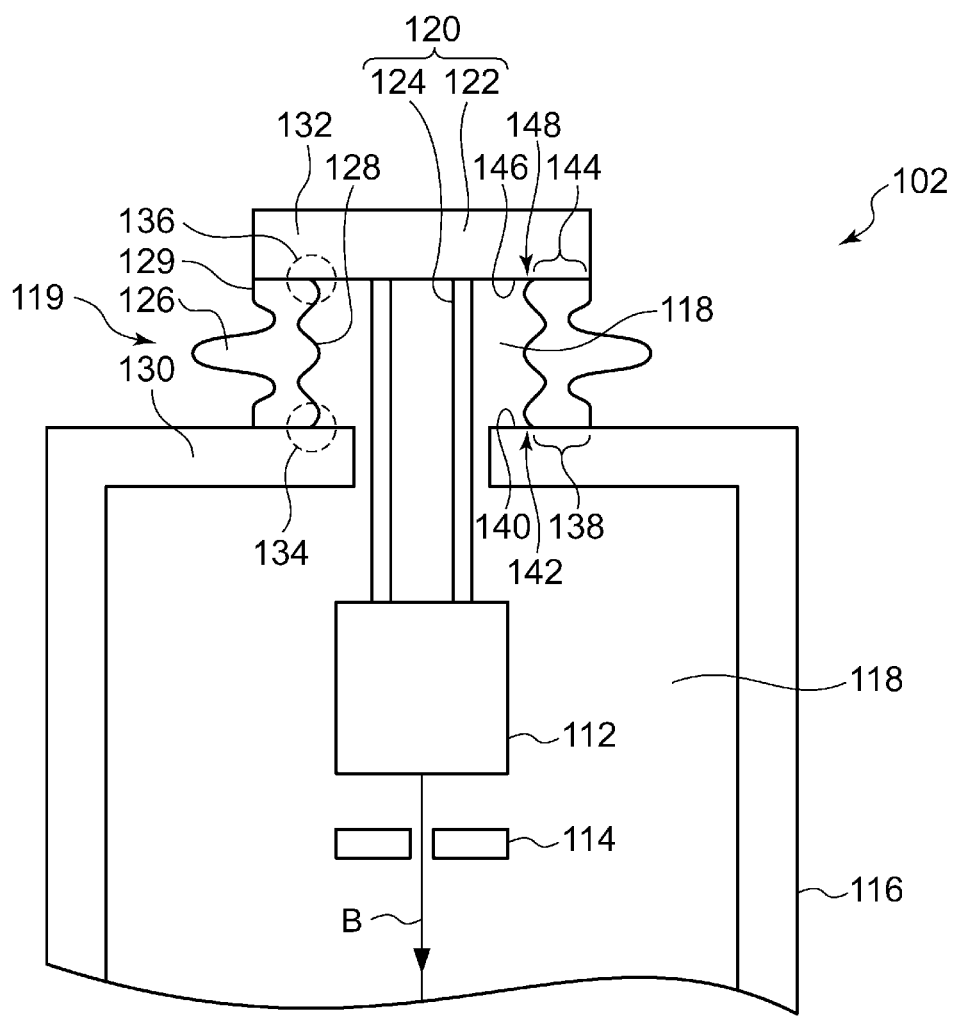
FIG. 2A is a diagram schematically illustrating an ion source device according to an embodiment of the present invention.

FIG. 2A is a diagram schematically illustrating the ion source device 102 according to an embodiment of the present invention. The ion source device 102 includes an ion source 112, an extraction electrode unit 114 for extracting the ion beam B from the ion source 112, and an ion source chamber 116 for housing the ion source 112 and the extraction electrode unit 114. The ion source chamber 116 is a vacuum container that surrounds the internal space 118 to be evacuated.

The ion source device 102 includes the ion source support portion 120 configured to support the ion source 112 in such a manner as to place the ion source 112 in the internal space 118. The ion source support portion 120 is constituted by a support plate 122 and a support body 124. One side of the support plate 122 faces the internal space 118, whereas the opposite side thereof faces an atmospheric environment or external environment. The support body 124 is contained in the internal space 118, and connects the ion source 112 to the support plate 122.

The ion source device 102 includes a bushing 126 used to connect the ion source chamber 116 and the ion source support portion 120. The bushing 126 is an insulator formed of an insulating material such as ceramics or resin. The bushing 126 is a hollow cylindrical component having a bushing inner wall surface 128 that surrounds the internal space 118. The bushing inner wall surface 128 is exposed to the internal space 118. Also, the bushing 126 has a bushing exterior wall surface 129 that is exposed to an external space 119. The bushing exterior wall surface 129 faces the atmospheric environment or external environment.

One end of the bushing 126 is secured to a first conductor flange 130, whereas the other end thereof is secured to a second conductor flange 132. The first conductor flange 130 constitutes a part of the ion source chamber 116 and is formed in a part of the ion source chamber 116 opposite to the support plate 122. If a wall portion of the ion source chamber 116 has an exterior wall and an inner wall (so-called liner), the first conductor flange 130 may be formed continuously to the inner wall. The second conductor flange 132 is formed on an outer periphery of the support plate 122. In this manner, the first conductor flange 130 and the second conductor flange 132 are disposed opposite each other with the bushing 126 held between them.

The ion source chamber 116 and the ion source support portion 120 are formed of an electrically conductive material such as metal (e.g., aluminum or aluminum alloy). The aforementioned power-supply device 111 (see FIG. 1) applies a first DC voltage to the ion source chamber 116, and applies a second DC voltage, which is higher than the first DC voltage, to the ion source support portion 120. Positive high voltages are applied to the ion source chamber 116 and the ion source support portion 120, respectively. Alternatively, negative voltages may be applied to the ion source chamber 116 and the ion source support portion 120, respectively. The ion source chamber 116 (or the first conductor flange 130) may be called a first conductor portion or first electrode body to which a low voltage is applied. And the ion source support portion 120 (or the second conductor flange 132) may be called a second conductor portion or second electrode body to which a high voltage is applied.

As described above, the ion source chamber 116 (or the first conductor flange 130) is mounted to one side of the bushing 126. A connection part of the ion source chamber 116 and the bushing 126 (bushing inner wall surface 128) faces the vacuum internal space 118. Also, the ion source support portion 120 (or the second conductor flange 132) is mounted to the other side of the bushing 126. A connection part of the ion source support portion 120 and the bushing 126 (bushing inner wall surface 128) also faces the internal space 118.

Figure 2B:
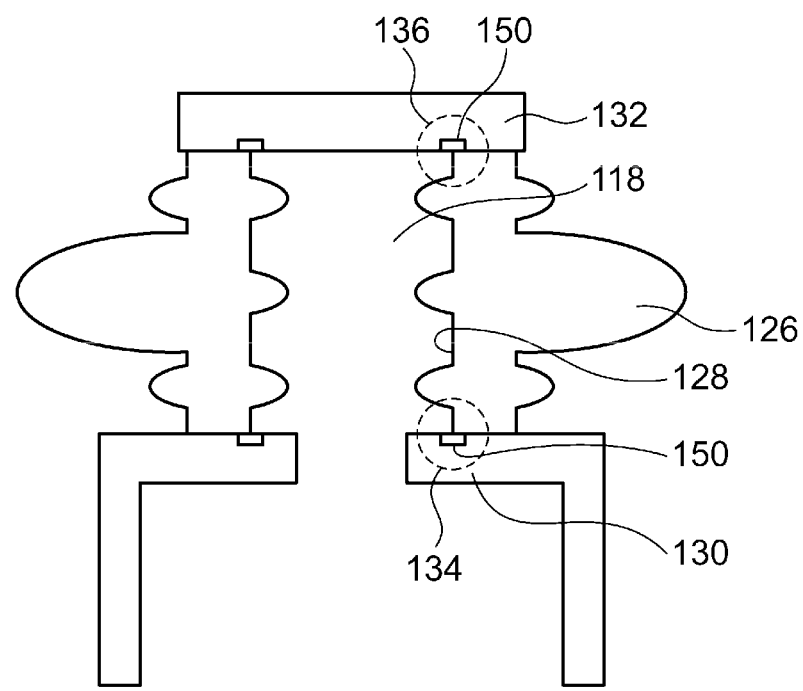
FIG. 2B is a diagram schematically illustrating an insulation structure of high voltage electrodes according to an embodiment of the present invention.

Thus, a boundary line of the conductor portion, the insulator and the vacuum (the boundary thereof being namely a so-called triple point or referred to as a triple junction also) is formed in the connection part of the ion source chamber 116 and the bushing 126 (bushing inner wall surface 128). For convenience of explanation, a neighborhood of this boundary line may be hereinafter referred to as a first triple point region 134. Similarly, a boundary line of the conductor portion, the insulator and the vacuum is also formed in the connection part of the ion source support portion 120 and the bushing 126 (bushing inner wall surface 128), and a neighborhood of this boundary line may be hereinafter referred to as a second triple point region 136. The first triple point region 134 and the second triple point region 136 are each formed in the shape of a circle along an end portion of the bushing inner wall surface 128. In FIG. 2A and FIG. 2B, the first triple point region 134 and the second triple point region 136 are each indicated by a circle in broken line.

The first conductor flange 130 has a first joint region 138, in contact with the bushing 126, on one side (outer side) of the first conductor flange 130 with the first triple point region 134 formed as a boundary. The first conductor flange 130 has a first exposed region 140, which is exposed to the internal space 118, on an opposite side (inner side) to the first joint region 138 with the first triple point region 134 as the boundary. The first conductor flange 130 has a first boundary zone 142 between the first joint region 138 and the first exposed region 140. The first boundary zone 142 extends along a boundary region between the first exposed region 140 and the bushing inner wall surface 128.

Similarly, the second conductor flange 132 has a second joint region 144, in contact with the bushing 126, on one side (outer side) of the second conductor flange 132 with the second triple point region 136 formed as a boundary. The second conductor flange 132 has a second exposed region 146, which is exposed to the internal space 118, on an opposite side (inner side) to the second joint region 144 with the second triple point region 136 as a boundary. The second conductor flange 132 has a second boundary zone 148 between the second joint region 144 and the second exposed region 146. The second boundary zone 148 extends along a boundary region between the second exposed region 146 and the bushing inner wall surface 128.

Note that the triple point is formed on an atmosphere side as well. The first conductor flange 130 (or the second conductor flange 132) has a region exposed to the external space 119. The first conductor flange 130 (or the second conductor flange 132) has another boundary zone between the exposed region to the external space 119 and the first joint region 138 (or the second joint region 144). A boundary line of the conductor, the insulator and the atmospheric space is formed between said other boundary zone and the bushing exterior wall surface 129.

Figure 3A:
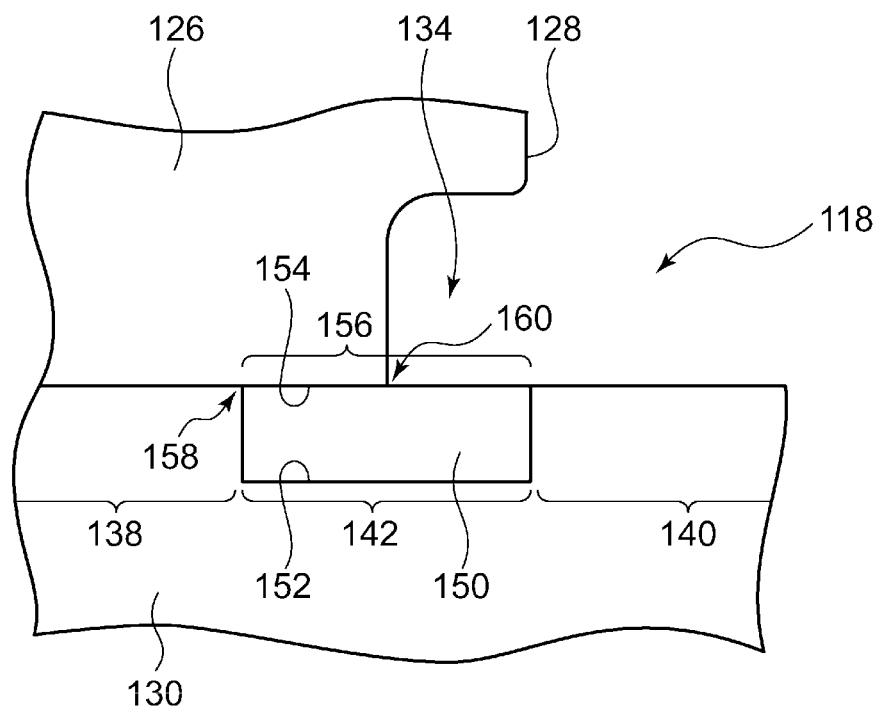
FIG. 3A is a cross-sectional view schematically illustrating an insulation structure of high voltage electrodes according to an embodiment of the present invention.
Figure 3B:
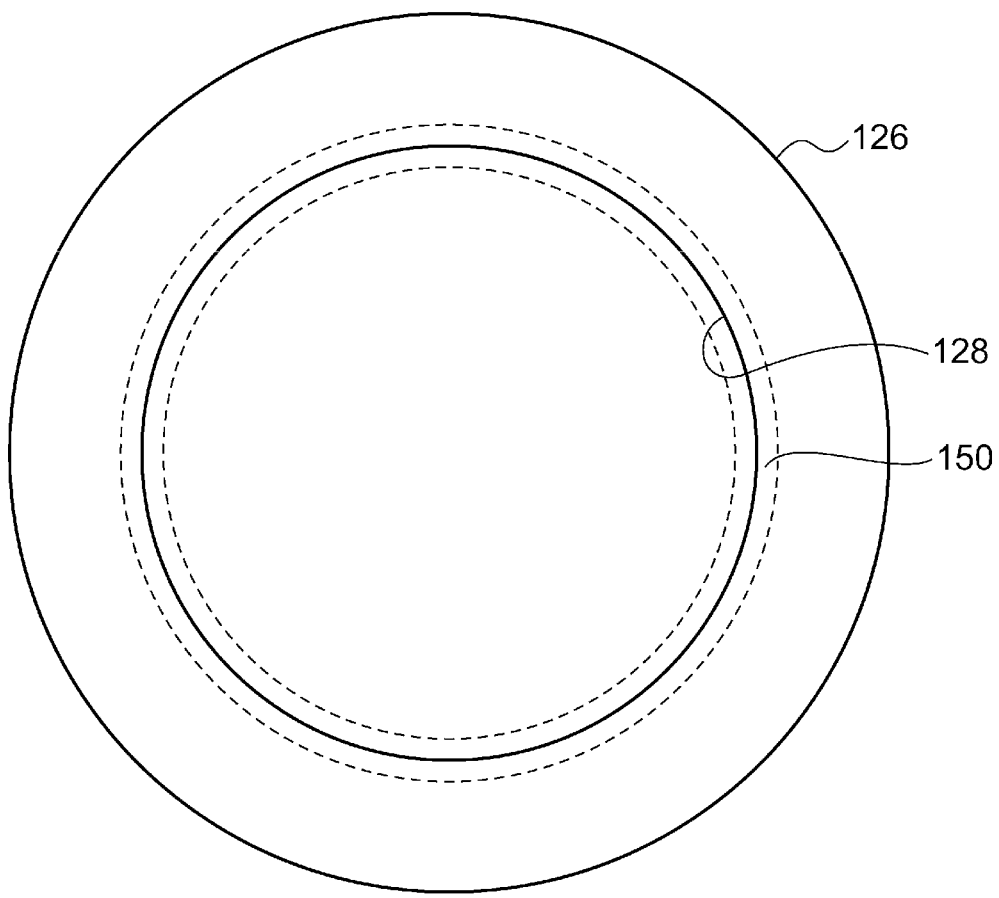
FIG. 3B is a top view schematically illustrating an insulation structure of high voltage electrodes according to an embodiment of the present invention.

FIG. 2B is a diagram schematically illustrating an insulation structure of high voltage electrodes according to an embodiment of the present invention. FIG. 2B schematically shows a positional relation between the first conductor flange 130, the second conductor flange 132, the bushing 126, and a conductor element 150; other structural components (e.g., the ion source 112) are omitted in FIG. 2B for simplicity of explanation. FIG. 3A is a cross-sectional view schematically illustrating an insulation structure of high voltage electrodes, formed in the first triple point region 134, according to an embodiment of the present invention. FIG. 3B is a top view schematically illustrating an insulation structure of high voltage electrodes according to an embodiment of the present invention.

Though its detail will be described later, the insulation structure of high voltage electrodes is configured such that a heat-resistant portion disposed adjacent to the bushing inner wall surface 128 is formed on the first conductor flange 130. The heat-resistant portion is provided along an edge of the joint region of the bushing 126 and the first conductor flange 130. The heat-resistant portion is an electrically conducting region having heat resistance.

As shown in FIG. 2B and FIG. 3A, the first conductor flange 130 has the conductor element 150. The first conductor flange 130 is a conductor body that supports the conductor element 150 on the surface of the conductor flange 130. The conductor element 150 is an additional ring-shaped member provided separately from the first conductor flange 130. Since the conductor element 150 is supported by the first conductor flange 130, the conductor element 150 has a potential equal to that of the first conductor flange 130.

The conductor element 150 is placed on the first boundary zone 142 such that the conductor element 150 lies adjacent to both the first joint region 138 and the bushing inner wall surface 128. The conductor element 150 is located adjacent to the first exposed region 140, too. The first boundary zone 142 is a part of the surface of the first conductor flange 130 covered by the conductor element 150. In FIG. 3A, the bushing inner wall surface 128 is positioned adjacent to and above the conductor element 150; the first joint region 138 is adjacent to and on the left side of the conductor element 150; and the first exposed region 140 is adjacent to and on the right side of the conductor element 150. The conductor element 150 is provided along the boundary region between the first exposed region 140 and the bushing inner wall surface 128.

FIG. 3B shows an end face of the bushing 126 that is in contact with the first conductor flange 130. The end face thereof is an electrode joint surface of the bushing 126 that connects the bushing 126 to the first conductor flange 130. The portion corresponding to the conductor element 150 is indicated by broken lines in FIG. 3B. As shown in FIG. 3B, the conductor element 150 is provided along the entire periphery of the bushing inner wall surface 128.

The entire conductor element 150 is received and contained in a recess 152 of the first conductor flange 130. The recess 152 is formed in the first conductor flange 130 and is disposed between the first boundary zone 142 and an opposing part 154. The opposing part 154 is a part of the bushing 126 opposite to the first boundary zone 142.

A part of top face 156 of the conductor element 150 (e.g., a half of top face 156 thereof) is exposed to the internal space 118 with the bushing inner wall surface 128 formed as a boundary. In order to practically form the triple point on the conductor element 150, the width of the part of top face 156 thereof exposed to the internal space 118 is preferably about 5 mm to about 10 mm or may be larger than 10 mm. Another part of top face 156 thereof (e.g., the remaining half of top face 156 thereof) is covered by the opposing part 154 of the bushing 126. Similarly, the width of the other part of top face 156 thereof covered by the opposing part 154 is preferably about 5 mm to about 10 mm or may be larger than 10 mm. The opposing part 154 is not exposed to the internal space 118.

The depth of the recess 152 is practically equal to thickness D of the conductor element 150. Accordingly, the top face 156, of the conductor element 150, which is located adjacent to the bushing inner wall surface 128 is practically coplanar with the first joint region 138 (and the first exposed region 140) of the first conductor flange 130.

The thickness D of the conductor element 150 (or the depth of the recess 152) may be set such that the top face 156 is positioned slightly below the first joint region 138 (and the first exposed region 140) (by approximately a tolerance of size, for instance). The difference in height between the top face 156 and the first joint region 138 (and the first exposed region 140) may be less than or equal to about 1 mm, or less than or equal to about 0.5 mm. In such a case, a gap is formed between the top face 156 of the conductor element 150 and the bushing inner wall surface 128. The gap serves to avoid the interference between the conductor element 150 and the bushing 126.

In contrast thereto, the thickness D of the conductor element 150 (or the depth of the recess 152) may be set such that the top face 156 is positioned slightly above the first joint region 138 (and the first exposed region 140). In such a case, the conductor element 150 may have flexibility and/or elasticity such that the top face 156 of the conductor element 150 is pressed against the opposing part 154 of the bushing 126 and thereby the top face 156 and the first joint region 138 become coplanar with each other.

The conductor element 150 is formed of a material that differs from the material constituting the first conductor flange 130. More specifically, the conductor element 150 is formed of an electrically conductive material whose melting point is higher than that of the first conductor flange 130. The conductor element 150 in its entirety forms a heat-resistant portion. For example, this conductive material may have an electric conductivity lower than that of the first conductor flange 130.

The conductor element 150 may be a plate or sheet formed of graphite, for instance. It is advantageous to use a graphite plate or graphite sheet as the conductor element 150 because the graphite plate or graphite sheet is inexpensive and the use thereof facilitates the handling.

From a practical perspective, however, the surface of the first joint region 138 (or the second joint region 144) and the surface of the bushing 126 adjacent thereto (i.e., the electrode joint surface) have microscopic asperities (e.g., microspikes). These asperities are formed by a machining process performed to manufacture the bushing 126 and the first conductor flange 130 (or the second conductor flange 132). As a result, microgaps are created between the first joint region 138 (or the second joint region 144) and the bushing 126. Residual gas may be present in the microgaps. When a high voltage is applied to the first conductor flange 130 (or the second conductor flange 132), an electric field stronger than that around the first conductor flange 130 or the second conductor flange 132 may be caused near the first triple point region 134 (or the second triple point region 136). Electrons may possibly be emitted into the microgaps from the microspikes.

Due to the aforementioned factors, an initial event of discharging, such as the supply of electrons and the ionization of a gas, is more likely to occur in the first triple point region 134 (or the second triple point region 136) than in other locations. If a material like aluminum whose melting point is low is present near a place where the initial event takes places, the evaporation of the material, the ionization of the gas, the electrostatic acceleration of ions, and the collision of ions with the nearby and surrounding members may develop synergistically.

If the bushing inner wall surface 128 comes into direct contact with the surface of the first conductor flange 130 (e.g., the first exposed region 140), the triple point consisting of a low-melting-point conductive material, an insulating material and a vacuum will be formed at such a contact portion. Thus, not only the initial event but also an electric discharge may occur frequently. Or the initial event may develop into a large-scale discharge.

If the discharge current is excessive, the voltage of power supply (e.g., the power-supply device 111) of the first conductor flange 130 (or the second conductor flange 132) can drop instantaneously. Such a variation in voltage may adversely affect the quality of ion beams generated by the ion source device 102. In extreme cases, the electrical discharge may cause damages, such as the carbonization, on the members around the first triple point region 134 (or the second triple point region 136). Over a long period of time, such damages will grow and, for example, a large-size carbonized path may possibly be formed on the surface of the insulator.

If no conductor element 150 were provided, the recess 152 would be open to the internal space 118. As a result, a boundary between the bushing 126, the first conductor flange 130 (or the second conductor flange 132), and the internal space 118 would be formed on an edge of the first joint region 138 (or the second joint region 144). For convenience of explanation, a triple point otherwise formed in the case when the aforementioned conductor element 150 is not provided may be hereinafter referred to as an "old triple point 158". In contrast to this, a triple point formed when the conductor element 150 is provided may be referred to as a "new triple point 160".

By employing the present embodiment, the old triple point 158 is hidden and covered by the conductor element 150, and the new triple point 160 is formed on the top face 156 of the conductor element 150. The new triple point 160 is the boundary of the high-melting-point conductive material, the insulating material, and the vacuum. Thus, the vaporization of the conductive material at the new triple point 160 is suppressed. As a result, the frequency of occurrence of electrical discharge can be suppressed. Or the scale of electrical discharge can be reduced.

As a result, by employing the present embodiment, the variation of a high voltage applied to the first conductor flange 130 (or the second conductor flange 132), caused by the electrical discharge, is suppressed. Hence, the quality of the ion beam B generated by the ion source device 102 is stabilized. The insulation structure of high voltage electrodes according to the present embodiment therefore contributes to an increased productivity of the ion implantation apparatus 100.

In the above-described embodiments, the insulation structure is formed in the first conductor flange 130. This structure is practically useful if the first conductor flange 130 is a negative electrode relative to the second conductor flange 132. This is because, in this case, the first conductor flange 130 may be an electron-emitting source. However, the insulation structure according to the present embodiment may be provided not only in the first conductor flange 130 but also in the second conductor flange 132 in a similar manner (see FIG. 2B). Alternatively, depending on the situation, the insulation structure may be provided in the second flange 132 only.

In the above described embodiments, the conductor element 150 is a graphite plate or graphite sheet. However, the material constituting the conductor element 150 may not be a pure graphite. The conductor element 150 may be formed of a material composed mainly of graphite (e.g., the purity of graphite being 80% or above, the same applies hereafter).

Also, the conductor element 150 may be formed of a high-melting-point metal, such as tungsten, tantalum or molybdenum, or formed of a material composed mainly of any of those high-melting-point metals. The conductor element 150 may be formed of a material composed mainly of silicon carbide, tantalum carbide or tungsten carbide. The conductor element 150 may be formed of a material composed mainly of iron or its alloy (e.g., pure iron, steel, stainless steel or the like).

The electric conductivity of a material constituting the conductor element 150 may be larger than or equal to that of the first conductor flange 130. Also, a part of the conductor element 150 may be formed of the same material as that constituting the first conductor flange 130.

In the above described embodiments, the conductor element 150 in its entirety is received and contained in the recess 152 of the first conductor flange 130. The recess 152 is formed in the first conductor flange 130 only. However, the recess 152 may be formed in both the first conductor flange 130 and the bushing 126.

Figure 4A:
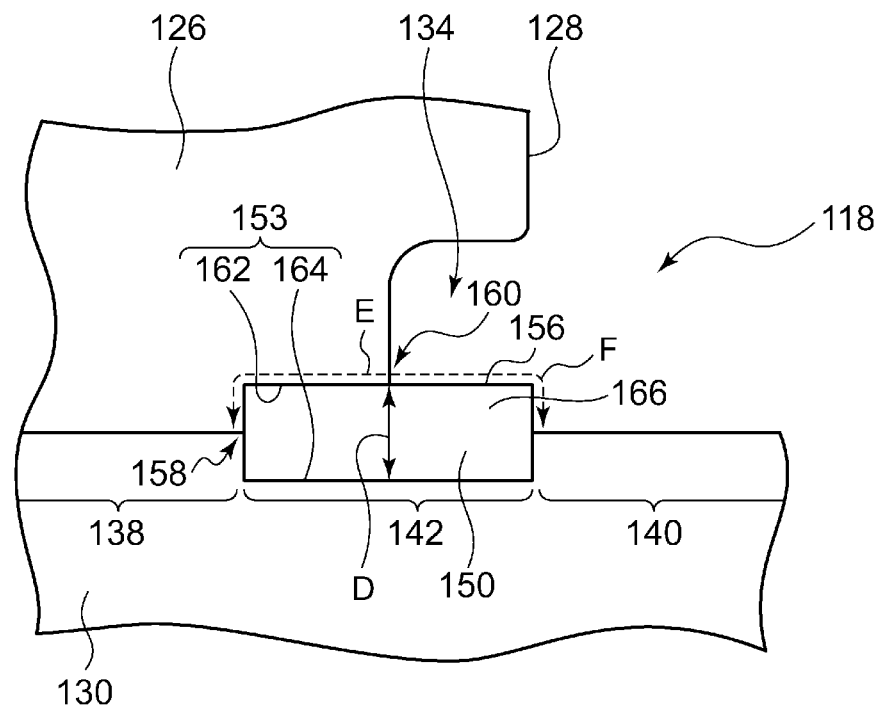
FIG. 4A is a cross-sectional view schematically illustrating an insulation structure of high voltage electrodes according to another embodiment of the present invention.

As shown in FIG. 4A, the conductor element 150 may be received and contained in a recess 153, which is comprised of an upper-side recess 162 and a lower-side recess 164. The lower-side recess 164 is formed in the first conductor flange 130, whereas the upper-side recess 162 is formed in the bushing 126 in a position facing the lower-side recess 164. In this structure as shown in FIG. 4A, the conductor element 150 has an exposed portion 166 protruding from the recess 153 into the internal space 118. Similar to the embodiment shown in FIG. 3A and FIG. 3B, this structure also allows the old triple point 158 to be covered by the conductor element 150 and allows the new triple point 160 to be formed on the top face 156 of the conductor element 150.

As the ion source device 102 continues to operate for a long period of time, the material constituting the conductor element 150 may be consumed near the new triple point 160. In order to make the conductor element 150 sufficiently durable, the thickness D of the conductor element 150 at the new triple point 160 is preferably about 30 μm or greater, or about 50 μm or greater, for instance. The thickness D may be in the range of about 0.1 mm to about 5 mm.

In order that the new triple point 160 is formed of a conductive material whose melting point is high, the creepage distance (indicated by an arrow E of a broken line) from the new triple point 160 to the first joint region 138 (i.e., the old triple point 158) is preferably about 0.5 mm or greater and/or about 5 mm or less (or about 10 mm or less). The creepage distance (indicated by an arrow F of a broken line) from the new triple point 160 to the first exposed region 140 is preferably about 0.5 mm or greater and/or about 5 mm or less (or about 10 mm or less).

Figure 4B:
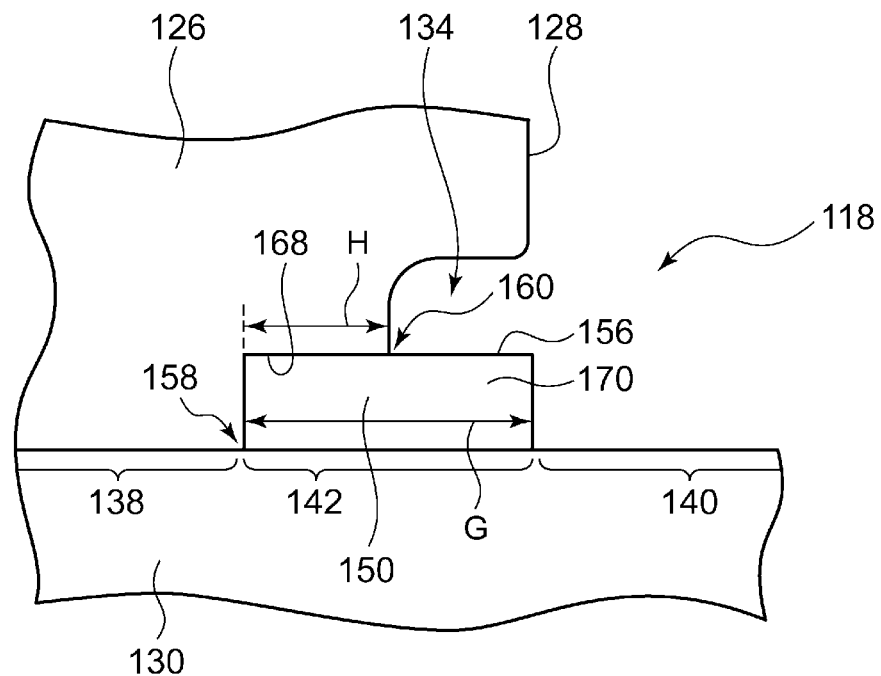
FIG. 4B is a cross-sectional view schematically illustrating an insulation structure of high voltage electrodes according to still another embodiment of the present invention.

Also, in substitution for the structure where the first conductor flange 130 has the recess that receives and contains the conductor element 150 therein, the conductor element 150 may be received and contained, in a bushing recess 168 formed in the bushing 126, as shown in FIG. 4B. Since the depth H of the bushing recess 168 is smaller than the width G of the conductor element 150, the conductor element 150 has an exposed portion 170 protruding from the bushing recess 168 into the internal space 118. With this structure, the old triple point 158 can be covered by the conductor element 150, and the new triple point 160 can be formed on the top face 156 of the conductor element 150, similarly to the embodiment shown in FIG. 3A and FIG. 3B.

The depth H of the bushing recess 168 may be larger than or equal to the width G of the conductor element 150 so that the entire conductor element 150 can be received and contained in the bushing recess 168 without the provision of the exposed portion 170. With this structure, the old triple point 158 can be covered by the conductor element 150, and the new triple point 160 can be formed on the top face 156 of the conductor element 150.

Figure 5:
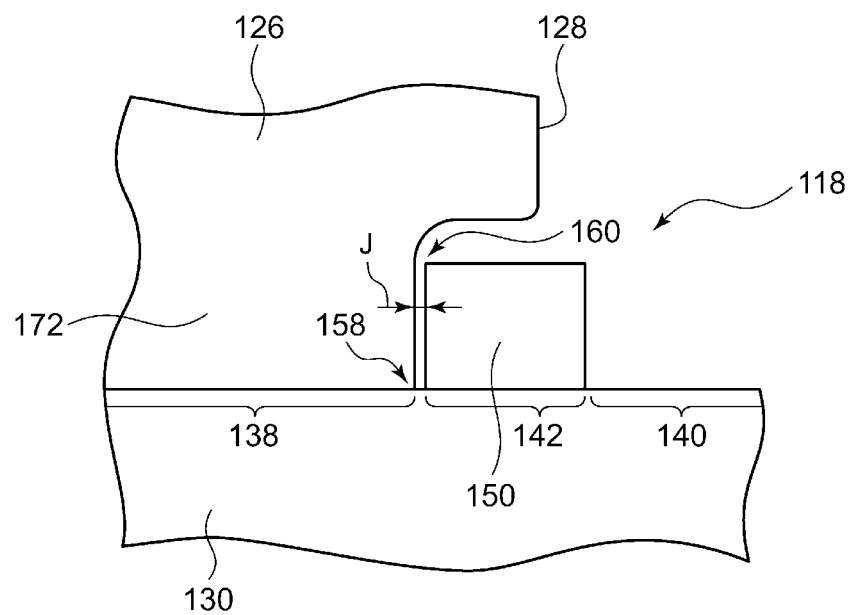
FIG. 5 is a cross-sectional view schematically illustrating an insulation structure of high voltage electrodes according to still another embodiment of the present invention.

Alternatively, the recess, which receives and contains the conductor element 150, may not be provided at all in both the first conductor flange 130 and the bushing 126. As shown in FIG. 5, the conductor element 150 is provided such that the conductor element 150 is located adjacent to a base 172 of the bushing 126 in contact with the first joint region 138. With this arrangement and structure, the conductor element 150 can be placed in such a manner as to hide and cover the existing old triple point 158 formed by first conductor flange 130 and bushing 126. The conductor element 150 is a cover, which covers the old triple point 158, so to speak.

The conductor element 150 may not be in contact with the base 172 of the bushing 126. In order to facilitate the attaching or detaching of the conductor element 150, a gap J between the conductor element 150 and the base 172 of the bushing 126 may be about 1 mm or less, or about 0.5 mm or less, for instance. With this structure, the new triple point 160 can be formed on the conductor element 150.

Figure 6:
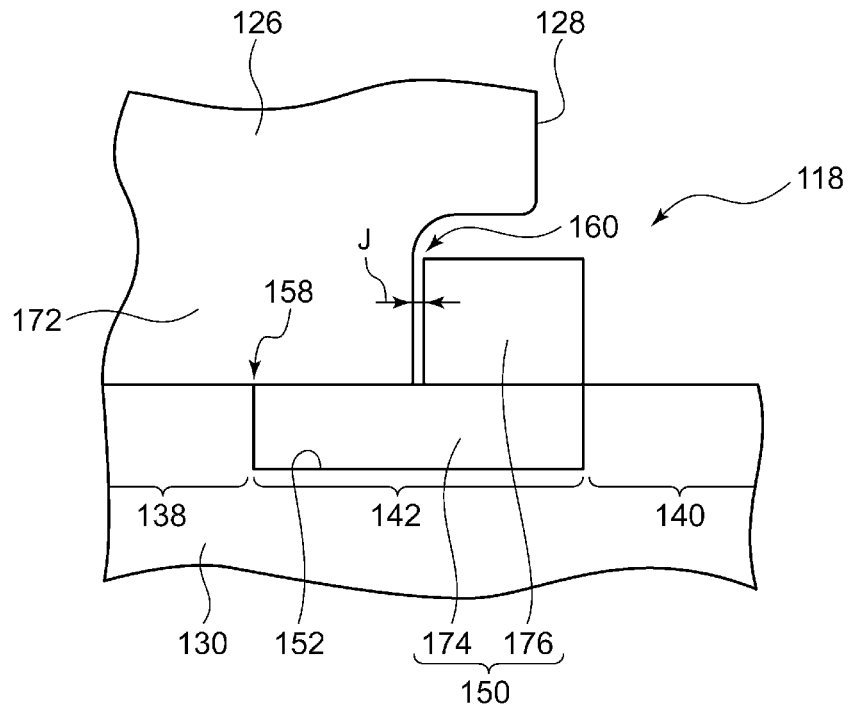
FIG. 6 is a cross-sectional view schematically illustrating an insulation structure of high voltage electrodes according to still another embodiment of the present invention.

As shown in FIG. 6, the conductor element 150 may be comprised of a plurality of members. For example, the conductor element 150 may be comprised of a first conductor member 174, which is received and contained in the recess 152, and a second conductor member 176, which is located adjacent to the base 172 of the bushing 126. The second conductor member 176 is provided on top of the first conductor member 174 in such a manner as to cover the exposed surface of the first conductor member 174.

The conductor element 150 is a ring-shaped member, as a whole, having an L-shaped cross section. On the other hand, the conductor elements 150 shown in FIG. 3A, FIG. 4A, FIG. 4B, and FIG. 5 each has a rectangular cross section. However, the cross section of the conductor element 150 is not limited only to an L-shape or a rectangle and may be of any other shapes.

In the above-described embodiments, as shown in FIG. 3B, the conductor element 150 is provided along the whole circumference of the bushing inner wall surface 128. The conductor element 150 is a member that extends continuously to the circumferential direction. In an embodiment, however, the conductor element 150 may be circumferentially partitioned into a plurality of sectors. Each gap between the plurality of partitioned conductor elements is preferably 0.5 mm or less.

Figure 7:
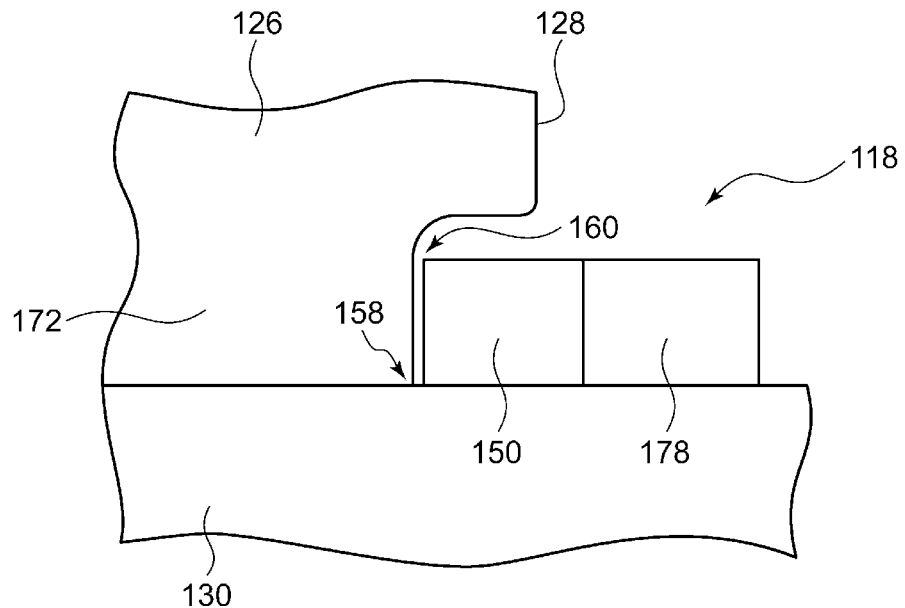
FIG. 7 is a cross-sectional view schematically illustrating an insulation structure of high voltage electrodes according to still another embodiment of the present invention.

As shown in FIG. 7, an insulation structure of high voltage electrodes according to an embodiment of the present invention may have a single or plurality of holding members 178 that holds or hold the conductor element 150. The holding member 178, provided on the first conductor flange 130, is located adjacent to the conductor element 150. The holding member 178 may be provided for the purpose of structurally supporting the conductor element 150. The holding member 178 may be provided for the purpose of facilitating the process of mounting the conductor element 150.

The holding member 178 is formed of a material different from that constituting the conductor element 150. Thus, the holding member 178 has a melting point and/or an electric conductivity that is different from that of the conductor element 150. The holding member 178 may be formed of a conductive material identical to or different from that constituting the first conductor flange 130. The holding member 178 may be formed of an insulating material.

The conductor element 150 may be secured to the holding member 178 such that the conductor element 150 and the holding member 178 are integrally structured as a single component. For example, the conductor element 150 may be bonded to the holding member 178 at the atomic level. The conductor element 150 may be a layer or film formed on the surface of the holding member 178. Alternatively, the conductor element 150 may be detachable from the holding member 178.

Figure 8:
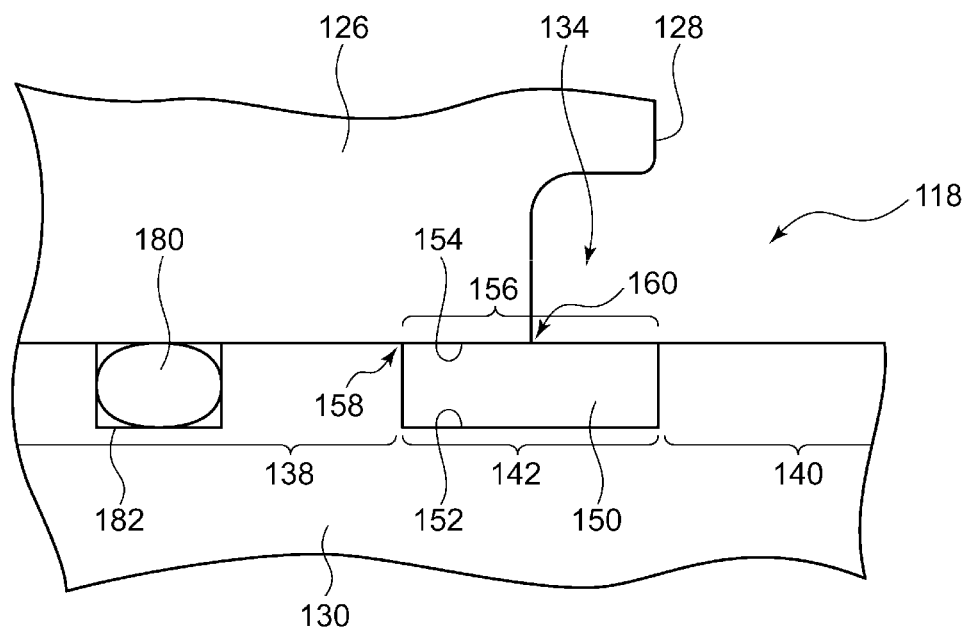
FIG. 8 is a cross-sectional view schematically illustrating an insulation structure of high voltage electrodes according to still another embodiment of the present invention.

As shown in FIG. 8, a vacuum sealing member 180 (e.g., O-ring) may be provided in between the first joint region 138 and the a part of the bushing 126, which is in contact with the first joint region 138. The vacuum sealing member 180 is provided as a member different from the conductor element 150 such that the vacuum sealing member 180 is spaced apart from the conductor element 150. The vacuum sealing member 180 is contained in a groove 182 formed in the first joint region 138 of the first conductor flange 130. Note that the groove 182 may be formed in the bushing 126.

Figure 9:
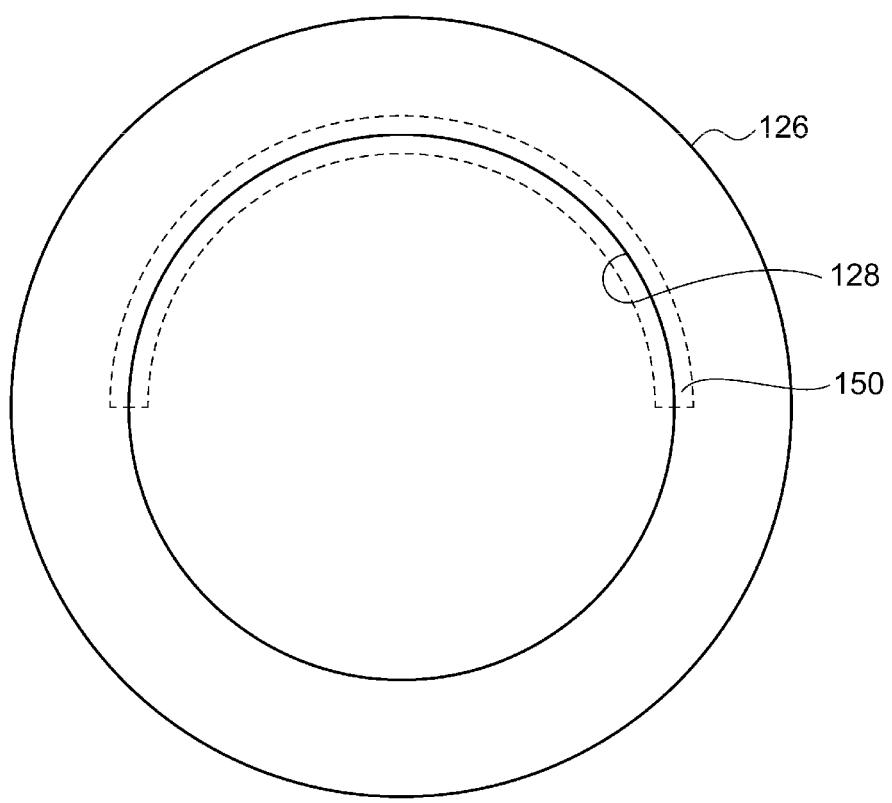
FIG. 9 is a top view schematically illustrating an insulation structure of high voltage electrodes according to still another embodiment of the present invention.

Similar to FIG. 3B, FIG. 9 shows an end face of the bushing 126 that is in contact with the first conductor flange 130. As shown in FIG. 9, the conductor element 150 may be formed along a part of the bushing inner wall surface 128 (e.g., a semicircle thereof). If the electrical discharge is likely to occur circumferentially at a specific location, the conductor element 150 may be provided in such a location and therefore no conductor element 150 may be provided in a location where the electric discharge is relatively less likely to occur. A circumferential shape of the conductor element 150 is not limited to an arc shape as shown in FIG. 9 as long as the creepage distance to other members in contact with the conductor element 150 is sufficiently maintained.

The present invention has been described based on the exemplary embodiments. Such description is for illustrative purposes only. It is understood by those skilled in the art that various changes in design and various modifications are possible and that such modifications are also within the scope of the present invention.

In the above-described embodiments, the surface of the first conductor flange 130 facing the bushing 126 is formed in a planar shape. In the embodiment described with reference to FIG. 3A, for example, the first joint region 138 and the first exposed region 140 of the first conductor flange 130 are coplanar with the top face 156 of the conductor element 150, and this plane surface and the first boundary zone 142 are parallel with each other. However, the relative positional relations between these components are not limited to such specific structures.

For example, the first boundary zone 142 may have a step or a difference in level such that a difference in height is created between the first joint region 138 and the first exposed region 140. In this case, the first exposed region 140 may be located at a level higher than the level (height) of the first joint region 138 or located at a level lower than the level thereof. Also, the first boundary zone 142 may have a corner such that the first joint region 138 and the first exposed region 140 intersect with each other. The first exposed region 140 may be tilted upward or downward relative to the first joint region 138. For example, the first exposed region 140 may be provided vertical relative to the first joint region 138.

Further, at least one of the first joint region 138, the first exposed region 140 and the first boundary zone 142 may not be flat and, for example, at least one of them have a protrusion or a recess. For example, the protrusion of the first exposed region 140 may be a cover, which covers the first joint region 138 and/or the first boundary zone 142 relative to the internal space 118, or a part of the cover.

Also, the conductor element 150 may cover at least part of the first exposed region 140. That is, the surface of the first conductor portion exposed to the internal space 118 may be covered by the conductor element 150. Alternatively, the conductor element 150 may cover at least part of the first joint region 138. In this case, the surface of the conductor element 150 may be bonded to the bushing 126.

In the above-described embodiments, the conductor element 150 is a separate member from the first conductor flange 130. However, in an embodiment, the conductor element 150 may be formed integrally with the first conductor flange 130 and therefore a heat-resistant portion adhered tightly to the first conductor flange 130 may be provided.

In the above-described embodiments, the conductor element 150 is formed of a material having heat resistance. However, the property of a material constituting the conductor element 150 may be construed differently. For example, the conductor element 150 may be formed of a material whose conductive electron density is small. Electron emission by sputtering is less likely to occur if a material, such as graphite, whose conductive electron density is relatively low is used. The conductor element 150 may be formed of a material whose work function is large. This is because the larger the work function is, less likely that the field emission will occur. Note that the work function of graphite or tungsten is larger than that of aluminum. In this manner, the conductor element 150 may be formed of an electron non-emitting material, which is less likely to emit electrons than the material constituting the first conductor flange 130 does. Here, the "electron non-emitting material" as used herein is a material that is less likely to emit electrons than the conductor portion where the conductor element 150 is provided. Since the emission of electrons into a space in the triple point region is suppressed, the occurrence frequency or scale of electric discharges can be reduced.

If the insulation structure of high voltage electrodes according to the embodiments of the present invention is formed in both the first conductor flange 130 and the second conductor flange 132, the insulation structures formed therein may be of mutually different structures. Any one of the above-described embodiments may be used for the first conductor flange 130, and any other of the embodiments may be used for the second conductor flange 132.

The insulation structure of high voltage electrodes according to the embodiments of the present invention is applicable to any of the conductor portions or electrode bodies in the ion source device 102. Also, the insulation structure of high voltage electrodes according to the embodiments of the present invention is applicable to any of conductor portions or electrode bodies in the ion implantation apparatus 100.

The insulation structure of high voltage electrodes according to the embodiments of the present invention is also applicable to two conductor portions or electrode bodies to each of which a AC high voltage is applied. In this case, the conductor element 150 may be provided in each of the two conductor portions or electrode bodies. For example, the conductor element 150 may be provided between a scanning electrode of the beam scanning device 110 and an insulator supporting this scanning electrode.

Also, the exposed surface of the insulator may be exposed to the vacuum space or atmospheric space. Alternatively, the exposed surface of the insulator may be exposed to a fluid space filled with a fluid such as insulating oil. Similarly, the exposed surface of the conductor body may be exposed to the vacuum space, the atmospheric space or the fluid space. Thus, the triple point may be formed between the conductor portion, the insulator and the vacuum space, between the conductor portion, the insulator and the atmospheric space or between the conductor portion, the insulator and the fluid space. The insulation structure for high voltage electrodes according to the present embodiment can be applicable to these triple points.

Several additional embodiments of the present invention are further listed as follows.

A0. An insulation structure of high voltage electrode(s) for an ion implantation apparatus, the insulation structure including:

an insulator having an exposed surface to a space; and a conductor portion having a joint region having contact with the insulator, an exposed region to the space, and a boundary zone, extending along the exposed surface of the insulator, between the joint region and the exposed region, wherein the conductor portion has a conductor body having the boundary zone and at least one conductor element disposed on the conductor body, and wherein the conductor element is provided on at least part of the boundary zone in such a manner as to be adjacent to the exposed surface of the insulator, and the conductor element is formed of a conductive material whose melting point is higher than that of the conductor portion.

A1. An insulation structure of high voltage electrodes for an ion implantation apparatus, the insulation structure including:

two conductor portions that are electrodes; and an insulator provided between the two conductor portions, wherein the two conductor portions are individually connected to the insulator, wherein the insulator has an exposed surface to a vacuum space, wherein each of the two conductor portions includes a conductor body having a joint region having contact with the insulator, an exposed region to the vacuum space, and a boundary zone lying between the joint region and the exposed region, wherein at least one of the two conductor portions has at least one conductor element disposed on the conductor body, and wherein the conductor element is provided on at least part of the boundary zone in such a manner as to be adjacent to the exposed surface of the insulator, and the conductor element is formed of a conductive material whose melting point is higher than that of the conductor portion.

A2. The insulation structure of high voltage electrodes according to the embodiment A0 or A1, wherein the conductor element is arranged such that the conductor element has a gap between the conductor element and the exposed surface of the insulator.

A3. The insulation structure of high voltage electrodes according to any of the embodiments A0 to A2, wherein the insulator has an opposing part opposite to the boundary zone, a recess is formed in at least one of the opposing part and the boundary zone, and at least part of the conductor element is contained in the recess.

A4. The insulation structure of high voltage electrodes according to any of the embodiments A0 to A3, wherein the conductor element is located adjacent to a base of the insulator in contact with the joint region.

A5. The insulation structure of high voltage electrodes according to any of the embodiments A0 to A4, further including a holding member that holds the conductor element, wherein the holding member is formed of a material different from that constituting the conductor element.

A6. The insulation structure of high voltage electrodes according to any of the embodiments A0 to A5, wherein the conductor element has a creepage distance of 0.5 mm or greater between the exposed surface of the insulator and the joint region.

A7. The insulation structure of high voltage electrodes according to any of the embodiments A0 to A6, wherein the conductor element has a creepage distance of 0.5 mm or greater between the exposed surface of the insulator and the exposed region.

A8. The insulation structure of high voltage electrodes according to any of the embodiments A0 to A7, wherein the conductor element has a thickness of 30 µm or greater between the exposed surface of the insulator and the conductor body.

A9. The insulation structure of high voltage electrodes according to any of the embodiments A0 to A8, wherein the space is a space to be evacuated, and a vacuum sealing member is provided between the joint region and the insulator.

A10. The insulation structure of high voltage electrodes according to any of the embodiments A0 to A9, wherein the exposed surface of the insulator is an inner wall surface of the insulator surrounding the space, and the conductor element is formed along an entire periphery of the inner wall surface.

A11. The insulation structure of high voltage electrodes according to any of the embodiments A0 to A9, wherein the exposed surface of the insulator is an inner wall surface of the insulator surrounding the space, and the conductor element is formed along a part of the inner wall surface.

A12. The insulation structure of high voltage electrodes according to any of the embodiments A0 to A11, wherein a first direct-current (DC) voltage is applied to a first conductor portion, and
a second conductor portion, to which a second DC voltage different from the first DC voltage is applied, is mounted to the insulator.

A13. The insulation structure of high voltage electrodes according to any of the embodiments A0 to A11, wherein a second conductor portion, which is different from the first conductor portion, is mounted to the insulator,
an alternate-current (AC) voltage is applied between the two conductor portions, and
the second conductor portion has a second conductor element.

A14. The insulation structure of high voltage electrodes according to any of the embodiments A0 to A13, wherein the conductive material contains graphite.

A15. The insulation structure of high voltage electrodes according to any of the embodiments A0 to A13, wherein the conductive material contains tungsten, tantalum or molybdenum.

A16. The insulation structure of high voltage electrodes according to any of the embodiments A0 to A13, wherein the conductive material contains silicon carbide, tantalum carbide or tungsten carbide.

A17. The insulation structure of high voltage electrodes according to any of the embodiments A0 to A13, wherein the conductive material contains iron.

A18. The insulation structure of high voltage electrodes according to any of the embodiments A0 to A17, wherein the conductor element is formed of an electron non-emitting material in substitution for the conductive material.

A19. An ion source device having the insulation structure of high voltage electrodes according to any of the embodiments A0 to A18.

A20. An ion implantation apparatus having the insulation structure of high voltage electrodes according to any of the embodiments A0 to A18.

B1. An insulation structure of high voltage electrode for an ion implantation apparatus, the insulation structure including:
an insulator having an exposed surface; and
a conductor portion including a joint region, having contact with the insulator, and a heat-resistant portion provided, along at least part of an edge of the joint region, in such a manner as to be adjacent to the exposed surface of the insulator,
wherein the heat-resistant portion is so provided as to have a gap between the heat-resistant portion and the exposed surface of the insulator and is formed of a conductive material whose melting point is higher than that of the conductor portion.

B2. The insulation structure of high voltage electrode according to the embodiment B1, wherein the conductor portion has at least one conductor element having the heat-resistant portion and disposed at the edge.

B3. The insulation structure of high voltage electrode according to the embodiment B1 or B2, wherein the insulator has an opposing part opposite to the edge of the joint region,
a recess is formed in at least one of the opposing part and the edge thereof, and
at least part of the heat-resistant portion is contained in the recess.

B4. The insulation structure of high voltage electrode according to any of the embodiments B1 or B3, wherein the heat-resistant portion is located adjacent to a base of the insulator in contact with the joint region.

B5. The insulation structure of high voltage electrode according to any of the embodiments B1 or B4, further including a holding member that holds the heat-resistant portion, wherein the holding member is formed of a material different from that constituting the heat-resistant portion.

B6. The insulation structure of high voltage electrode according to any of the embodiments B1 or B5, wherein the heat-resistant portion has a creepage distance of 0.5 mm or greater between the exposed surface of the insulator and the joint region.

B7. The insulation structure of high voltage electrode according to any of the embodiments B1 to B6, wherein the heat-resistant portion has a creepage distance of 0.5 mm or greater between the exposed surface of the insulator and the exposed region.

B8. The insulation structure of high voltage electrode according to any of the embodiments B1 to B7, wherein the heat-resistant portion has a thickness of 30 μm or greater between the exposed surface of the insulator and the conductor body.

B9. The insulation structure of high voltage electrode according to any of the embodiments B1 to B8, wherein the exposed surface is a surface exposed to a space to be evacuated, and a vacuum sealing member is provided between the joint region and the insulator.

B10. The insulation structure of high voltage electrode according to any of the embodiments B1 to B9, wherein the exposed surface of the insulator is an inner wall surface of the insulator, and the heat-resistant portion is formed along an entire periphery of the inner wall surface.

B11. The insulation structure of high voltage electrode according to any of the embodiments B1 to B9, wherein the exposed surface of the insulator is an inner wall surface of the insulator, and the heat-resistant portion is formed along a part of the inner wall surface.

B12. The insulation structure of high voltage electrode according to any of the embodiments B1 to B11, wherein a first DC voltage is applied to the conductor portion, and
wherein a second conductor portion, to which a second DC voltage different from the first DC voltage is applied, is mounted to the insulator.

B13. The insulation structure of high voltage electrode according to any of the embodiments B1 or B11, wherein a second conductor portion, which is different from the conductor portion, is mounted to the insulator,
an AC voltage is applied between the two conductor portions, and
the second conductor portion has a second heat-resistant portion.

B14. The insulation structure of high voltage electrode according to any of the embodiments B1 to B13, wherein the conductive material contains graphite.

B15. The insulation structure of high voltage electrode according to any of the embodiments B1 to B13, wherein the conductive material contains tungsten, tantalum or molybdenum.

B16. The insulation structure of high voltage electrode according to any of the embodiments B1 to B13, wherein the conductive material contains silicon carbide, tantalum carbide or tungsten carbide.

B17. The insulation structure of high voltage electrode according to any of the embodiments B1 to B13, wherein the conductive material contains iron.

B18. The insulation structure of high voltage electrode according to any of the embodiments B1 to B17, wherein the conductor element is formed of an electron non-emitting material in substitution for the conductive material.

B19. An ion source device having the insulation structure of high voltage electrode according to any of the embodiments B1 to B18.

B20. An ion implantation apparatus having the insulation structure of high voltage electrode according to any of the embodiments B1 to B18.

C. An electrode body structure for vacuum, wherein at least two electrode bodies are arranged such that the electrode bodies are joined with an insulator held between the electrode bodies,
wherein a DC or AC voltage having an effective value of 1 kV or greater is applied between the respective electrode bodies,
wherein at least part of a joint portion of each electrode body and the insulator is in contact with vacuum, and a boundary line (so-called triple point) of each electrode body, the insulator and the vacuum is formed,
wherein an electrically conductive additional member constituted by a high-melting-point material is placed near the insulator and each electrode body in such a manner as to hide and cover the original triple point,
wherein an electrical potential of the additional member is set equal to that of each electrode body, and
wherein, in a part where the additional member has been mounted, the triple point (boundary line of the insulator, the conductor and vacuum in contact with each other) is formed on the additional member.

It should be understood that the invention is not limited to the above-described embodiments, but may be modified into various forms on the basis of the spirit of the invention. Additionally, the modifications are included in the scope of the invention.

Priority is claimed to Japanese Patent Application No. 2013-70963, filed on Mar. 29, 2013, the entire content of which is incorporated herein by reference.

What is claimed is:

1. An insulation structure of high voltage electrodes for an ion implantation apparatus, the insulation structure comprising:
two conductor portions that are electrodes; and
an insulator provided between the two conductor portions,
wherein the two conductor portions are individually connected to the insulator,
wherein the insulator has an exposed surface to a vacuum space,
wherein each of the two conductor portions includes a conductor body having a joint region having contact with the insulator, an exposed region to the vacuum space, and a boundary zone lying between the joint region and the exposed region,
wherein at least one of the two conductor portions has at least one heat-resistant conductor element disposed on the conductor body, and
wherein the heat-resistant conductor element is provided on at least part of the boundary zone in such a manner as to be adjacent to the exposed surface of the insulator, and the heat-resistant conductor element is formed of a conductive material whose melting point is higher than that of the conductor portion.

2. The insulation structure of high voltage electrodes according to claim 1, wherein the heat-resistant conductor element is arranged such that the heat-resistant conductor element has a gap between the heat-resistant conductor element and the exposed surface of the insulator.

3. The insulation structure of high voltage electrodes according to claim 1, wherein the insulator has an opposing part opposite to the boundary zone,
a recess is formed in at least one of the opposing part and the boundary zone, and
at least part of the heat-resistant conductor element is contained in the recess.

4. The insulation structure of high voltage electrodes according to claim 1, wherein the heat-resistant conductor element is located adjacent to a base of the insulator in contact with the joint region.

5. The insulation structure of high voltage electrodes according to claim 1, further including a holding member configured to hold the heat-resistant conductor element, wherein the holding member is formed of a material different from that constituting the heat-resistant conductor element.

6. The insulation structure of high voltage electrodes according to claim 1, wherein the heat-resistant conductor element has a creepage distance of 0.5 mm or greater between the exposed surface of the insulator and the joint region.

7. The insulation structure of high voltage electrodes according to claim 1, wherein the heat-resistant conductor element has a creepage distance of 0.5 mm or greater between the exposed surface of the insulator and the exposed region.

8. The insulation structure of high voltage electrodes according to claim 1, wherein the heat-resistant conductor element has a thickness of 30 μm or greater between the exposed surface of the insulator and the conductor body.

9. The insulation structure of high voltage electrodes according to claim 1, wherein a vacuum sealing member is provided between the joint region and the insulator.

10. The insulation structure of high voltage electrodes according to claim 1, wherein the exposed surface of the insulator is an inner wall surface of the insulator surrounding the vacuum space, and the heat-resistant conductor element is formed along an entire periphery of the inner wall surface.

11. The insulation structure of high voltage electrodes according to claim 1, wherein the exposed surface of the insulator is an inner wall surface of the insulator surrounding the vacuum space, and the heat-resistant conductor element is formed along a part of the inner wall surface.

12. The insulation structure of high voltage electrodes according to claim 1, wherein a first direct-current (DC) voltage is applied to one of the two conductor portions, and a second DC voltage different from the first DC voltage is applied to the other of the two conductor portions.

13. The insulation structure of high voltage electrodes according to claim 1, wherein an alternate-current (AC) voltage is applied between the two conductor portions, and
each of the two conductor portions has the heat-resistant conductor element.

14. The insulation structure of high voltage electrodes according to claim 1, wherein the conductive material contains graphite.

15. The insulation structure of high voltage electrodes according to claim 1, wherein the conductive material contains tungsten, tantalum or molybdenum.

16. The insulation structure of high voltage electrodes according to claim 1, wherein the conductive material contains silicon carbide, tantalum carbide or tungsten carbide.

17. The insulation structure of high voltage electrodes according to claim 1, wherein the conductive material contains iron.

18. The insulation structure of high voltage electrodes according to claim 1, wherein the heat-resistant conductor element is formed of an electron non-emitting material in substitution for the conductive material.

19. An ion source device comprising the insulation structure of high voltage electrodes according to claim 1.

20. An ion implantation apparatus comprising the insulation structure of high voltage electrodes according to claim 1.

21. An insulation structure of high voltage electrodes for an ion implantation apparatus, the insulation structure comprising:
two conductor portions that are electrodes; and
an insulator provided between the two conductor portions,
wherein the two conductor portions are individually connected to the insulator,
wherein the insulator has an exposed surface to an atmospheric space,
wherein each of the two conductor portions includes a conductor body having a joint region having contact with the insulator, an exposed region to the atmospheric space, and a boundary zone lying between the joint region and the exposed region,
wherein at least one of the two conductor portions has at least one heat-resistant conductor element disposed on the conductor body, and
wherein the heat-resistant conductor element is provided on at least part of the boundary zone in such a manner as to be adjacent to the exposed surface of the insulator, and the heat-resistant conductor element is formed of a conductive material whose melting point is higher than that of the conductor portion.

22. An insulation structure of high voltage electrodes for an ion implantation apparatus, the insulation structure comprising:
two conductor portions that are electrodes; and
an insulator provided between the two conductor portions,
wherein the two conductor portions are individually connected to the insulator,
wherein the insulator has a first exposed surface to a vacuum space and a second exposed surface to an atmospheric space,
wherein each of the two conductor portions includes a conductor body having a joint region having contact with the insulator, a first exposed region to the vacuum space, a second exposed region to the atmospheric space, a first boundary zone lying between the joint region and the first exposed region, and a second boundary zone lying between the joint region and the second exposed region,
wherein at least one of the two conductor portions has at least one heat-resistant conductor element disposed on the conductor body, and
wherein the heat-resistant conductor element is provided on at least part of the first boundary zone and/or the second boundary zone in such a manner as to be adjacent to the exposed surface of the insulator, and the heat-resistant conductor element is formed of a conductive material whose melting point is higher than that of the conductor portion.

23. An insulation structure of high voltage electrodes for an ion implantation apparatus, the insulation structure comprising:
two conductor portions that are electrodes; and
an insulator provided between the two conductor portions,
wherein the two conductor portions are individually connected to the insulator,
wherein the insulator has an exposed surface to a fluid space,
wherein each of the two conductor portions includes a conductor body having a joint region having contact with the insulator, an exposed region to the fluid space, and a boundary zone lying between the joint region and the exposed region,
wherein at least one of the two conductor portions has at least one heat-resistant conductor element disposed on the conductor body, and
wherein the heat-resistant conductor element is provided on at least part of the boundary zone in such a manner as to be adjacent to the exposed surface of the insulator, and the heat-resistant conductor element is formed of a conductive material whose melting point is higher than that of the conductor portion.

* * * * *